US005783482A

United States Patent [19]

Lee et al.

[11] Patent Number: 5,783,482

[45] Date of Patent: Jul. 21, 1998

[54] METHOD TO PREVENT OXIDE PEELING INDUCED BY SOG ETCHBACK ON THE WAFER EDGE

[75] Inventors: Shing-Long Lee; Yeong-Rong Chang, both of Shin-Chu; Weng Liang Fang, Hsin-Chu; Cheng-Hao Huang, Taipei, all of Taiwan

[73] Assignee: Taiwan Semiconductor Manufacturing Company, Ltd., Hsin-Chu, Taiwan

[21] Appl. No.: 928,228

[22] Filed: Sep. 12, 1997

[51] Int. Cl.$^6$ .......... H01L 21/31

[52] U.S. Cl. .......... 438/624; 438/699; 438/631; 438/637; 438/906

[58] Field of Search .......... 438/624, 763, 438/782, 795, 637, 622, 640, 781, 631, 699, 906

[56] References Cited

U.S. PATENT DOCUMENTS

| | | | |
|---|---|---|---|
| 4,654,115 | 3/1987 | Egitto et al. | 156/643 |
| 5,534,110 | 7/1996 | Lenz et al. | 156/643.1 |
| 5,567,658 | 10/1996 | Wang et al. | 438/714 |
| 5,569,618 | 10/1996 | Matsubara | 438/699 |

*Primary Examiner*—Charles L Bowers, Jr.
*Assistant Examiner*—Matthew Whipple

*Attorney, Agent, or Firm*—George O. Saile; Stephen B. Ackerman; Rosemary L. S. Pike

[57] ABSTRACT

A method for avoiding oxide peeling by removing polymer contaminants from the edge of a wafer is described. An interlevel dielectric sandwich layer is formed by depositing a first oxide layer overlying semiconductor device structures in and on a semiconductor substrate, coating a spin-on-glass layer overlying the first oxide layer and rinsing the spin-on-glass layer whereby an edge bead rinse hump is formed a first distance from the edge of the wafer, etching back the spin-on-glass layer wherein the wafer is held by a clamp a second distance from the edge of the wafer wherein the second distance is smaller than the first distance and wherein the etching back of the spin-on-glass layer forms the polymer on the surface of the first oxide layer under the clamp at a third distance between the first and second distances, and depositing a second oxide layer overlying the etched back spin-on-glass layer and the polymer at the edge of the wafer to complete the interlevel dielectric sandwich layer. A layer of photoresist is coated overlying the sandwich layer wherein the photoresist layer does not extend closer to the edge of the wafer than the third distance and patterned to form a photoresist mask. The interlevel dielectric sandwich layer is etched away where it is not covered by the mask to form via openings wherein the second oxide layer overlying the polymer is etched away. The photoresist mask is stripped whereby the polymer is also removed thereby avoiding oxide peeling at the edge of the wafer.

14 Claims, 4 Drawing Sheets

METHOD TO PREVENT OXIDE PEELING INDUCED BY SOG ETCHBACK ON THE WAFER EDGE

BACKGROUND OF THE INVENTION (1). Field of the Invention

The present invention relates to the fabrication of integrated circuit devices, and more particularly, to a method of preventing oxide peeling caused by a persistent polymer resulting from spin-on-glass etchback at the wafer edge in the fabrication of integrated circuit devices.

(2). Description of the Prior Art

During spin-on-glass etchback, the wafer is held at its edge by a clamp. The etching back of the spin-on-glass material produces a polymer which builds up under the edge of the clamp on the wafer surface. This polymer cannot be removed by the conventional plasma treatment. An oxide layer deposited over the wafer after spin-on-glass etchback will cover the polymer buildup. During the subsequent vacuum bake step, this high temperature treatment will cause the polymer buildup to inflate which will cause peeling away of the overlying oxide layer. Additionally, the peeled oxide will contaminate the production tools and the wafer.

U.S. Pat. No. 4,654,115 to Egitto et al teaches a two-step masking method for removing contaminants from through-holes using a plasma etch. U.S. Pat. No. 5,534,110 to Lenz et al discloses a new clamp for holding a wafer at its edge. The new clamp has a gap wherein polymer can build up without touching the wafer.

SUMMARY OF THE INVENTION

Accordingly, it is a primary object of the invention to provide a reliable and very manufacturable process for removing polymer contaminants from the edge of a wafer.

A further object of the invention is to provide a process for removing polymer contaminants from the edge of a wafer where the wafer is held by a conventional clamping mechanism.

Another object is to provide a process in which oxide peeling at the edge of a wafer is avoided.

Yet another object of the invention is to provide a process to avoid tool and wafer contamination by oxide flaking.

Yet another object is to provide a process in which oxide peeling at the edge of a wafer is avoided by removing polymer contaminants from the edge of the wafer.

In accordance with the objects of the invention, a method for avoiding oxide peeling by removing polymer contaminants from the edge of a wafer is achieved. Semiconductor device structures are provided in and on a semiconductor substrate. An interlevel dielectric sandwich layer is formed by depositing a first oxide layer overlying the device structures, coating a spin-on-glass layer overlying the first oxide layer and rinsing the spin-on-glass layer whereby an edge bead rinse hump is formed a first distance from the edge of the wafer, etching back the spin-on-glass layer wherein the wafer is held at the edge by a clamp a second distance from the edge of the wafer wherein the second distance is smaller than the first distance and wherein the etching back of the spin-on-glass layer forms the polymer on the surface of the first oxide layer under the clamp at a third distance between the first and second distances, and depositing a second oxide layer overlying the etched back spin-on-glass layer and overlying the polymer at the edge of the wafer to complete the interlevel dielectric sandwich layer. A layer of photoresist is coated overlying the interlevel dielectric sandwich layer wherein the photoresist layer does not extend closer to the edge of the wafer than the third distance. The photoresist layer is patterned to form a photoresist mask. The interlevel dielectric sandwich layer is etched away where it is not covered by the photoresist mask to form via openings wherein the second oxide layer overlying the polymer is etched away. The photoresist mask is stripped whereby the polymer is also removed thereby avoiding oxide peeling at the edge of the wafer in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
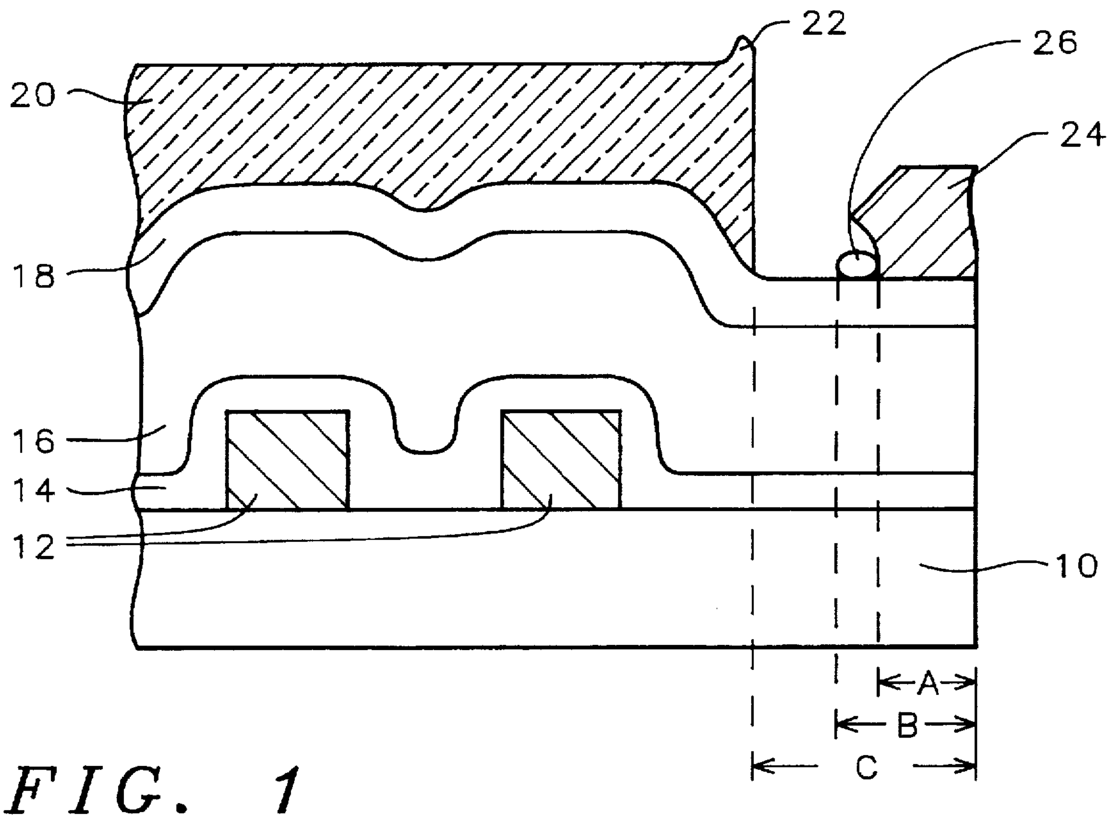
FIGS. 1 through 3 are cross-sectional representations of a preferred embodiment of the present invention.

Referring now more particularly to FIG. 1, there is shown a portion of a partially completed integrated circuit. The semiconductor substrate 10 is preferably composed of monocrystalline silicon in which may be formed semiconductor device structures which may include gate electrodes and source and drain regions, not shown. A first level of metallization is shown by metal lines 12.

The gaps between the metal lines are filled by a conventional gap-filling technique, such as by depositing a first layer 14 of plasma-enhanced oxide (PEOX) to a thickness of about 2000 Angstroms, followed by depositing a gap-filling layer of oxide 16 by subatmospheric pressure chemical vapor deposition (SACVD) to a thickness of about 5000 Angstroms.

A spin-on-glass sandwich planarizing intermetal dielectric layer is formed over the top surface of the SACVD oxide layer 16. A conformal layer of silicon oxide 18, such as PEOX, is deposited to a thickness of about 2000 Angstroms. This is the first layer of the dielectric sandwich layer.

Now a silicate or siloxane spin-on-glass coating 20 is applied to a thickness of between about 5700 to 6300 Angstroms. The spin-on-glass coating is followed by an EBR rinse. The edge bead particles are removed leaving an edge bead rinse hump 22. The spin-on-glass layer is baked and cured, as is conventional.

Figure 2:
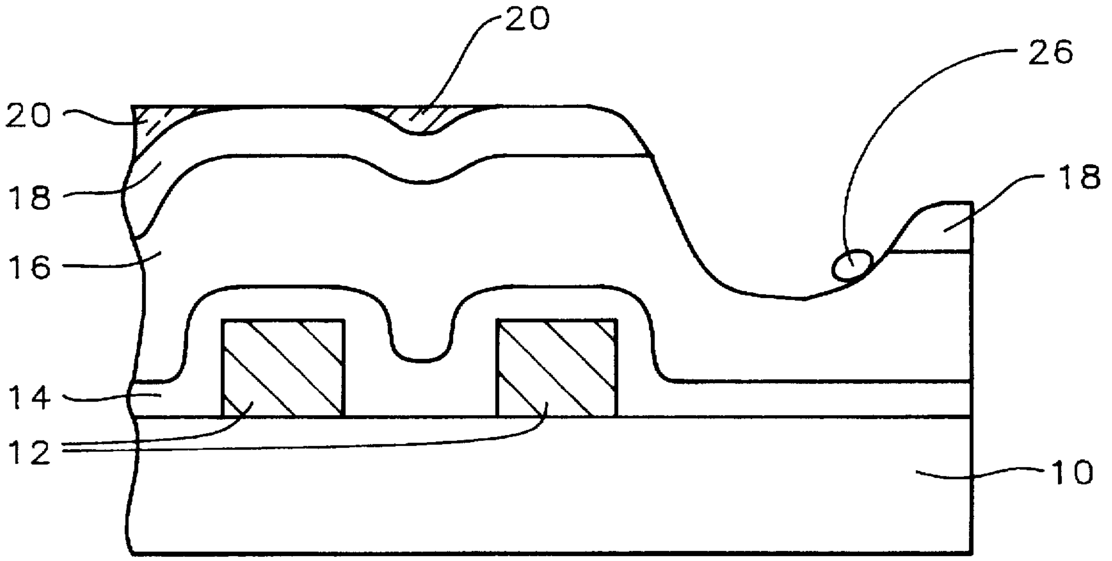

The spin-on-glass layer 20 is now to be etched back to planarize the dielectric layer. A clamp 24 holds the wafer in place at its edge. The spin-on-glass layer is etched back as shown in FIG. 2. During etchback, a polymer 26 is formed and builds up on the wafer surface underlying the clamp 24. Conventionally, the clamp holds the wafer to the distance A, about 1.5 mm from the edge of the wafer. The polymer buildup occurs at B, from 1.5 to 2.25 mm from the edge of the wafer. The spin-on-glass edge bead rinse formation 22 is at distance C, about 3 mm from the edge of the wafer.

The polymer 26 remains on the surface of the wafer after the clamp is removed. The polymer 26 cannot be removed by conventional plasma treatment. In experimentation, the inventors have found that only a wet photoresist strip will remove the polymer induced by spin-on-glass etchback. However, if a wet PR strip is used at this point, the spin-on-glass layer will absorb water from the wet strip which will cause reliability problems.

Figure 3:
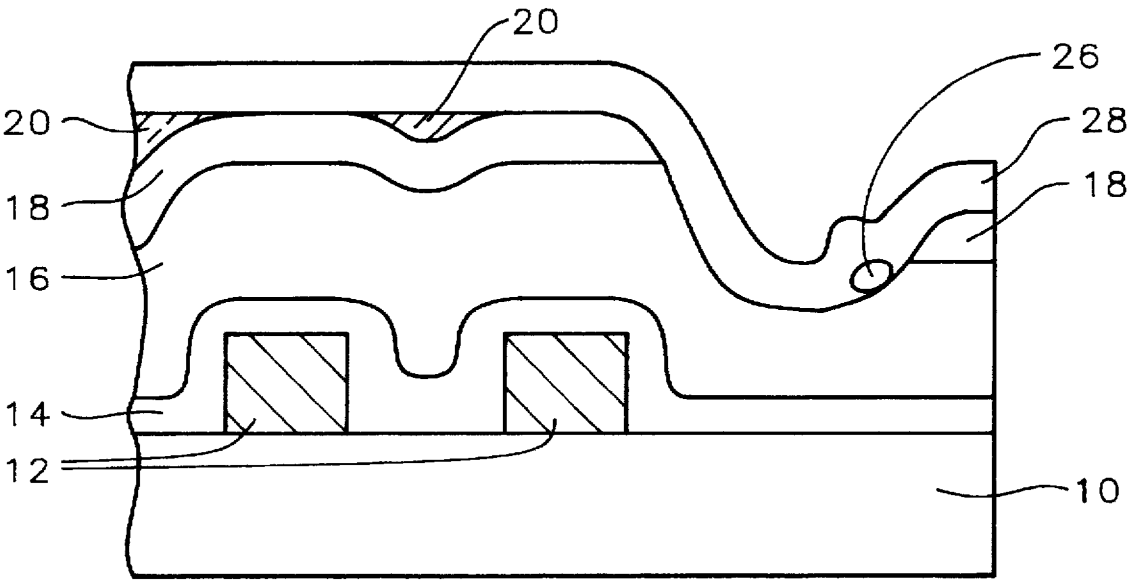

Finally, the top layer of the spin-on-glass sandwich is deposited. A second layer 28 of PEOX, or the like, is deposited over the etched back spin-on-glass layer to a thickness of between about 2700 and 3300 Angstroms completing the dielectric sandwich layer, as illustrated in FIG. 3. The polymer buildup 26 is covered by the top dielectric layer 28.

Figure 4:
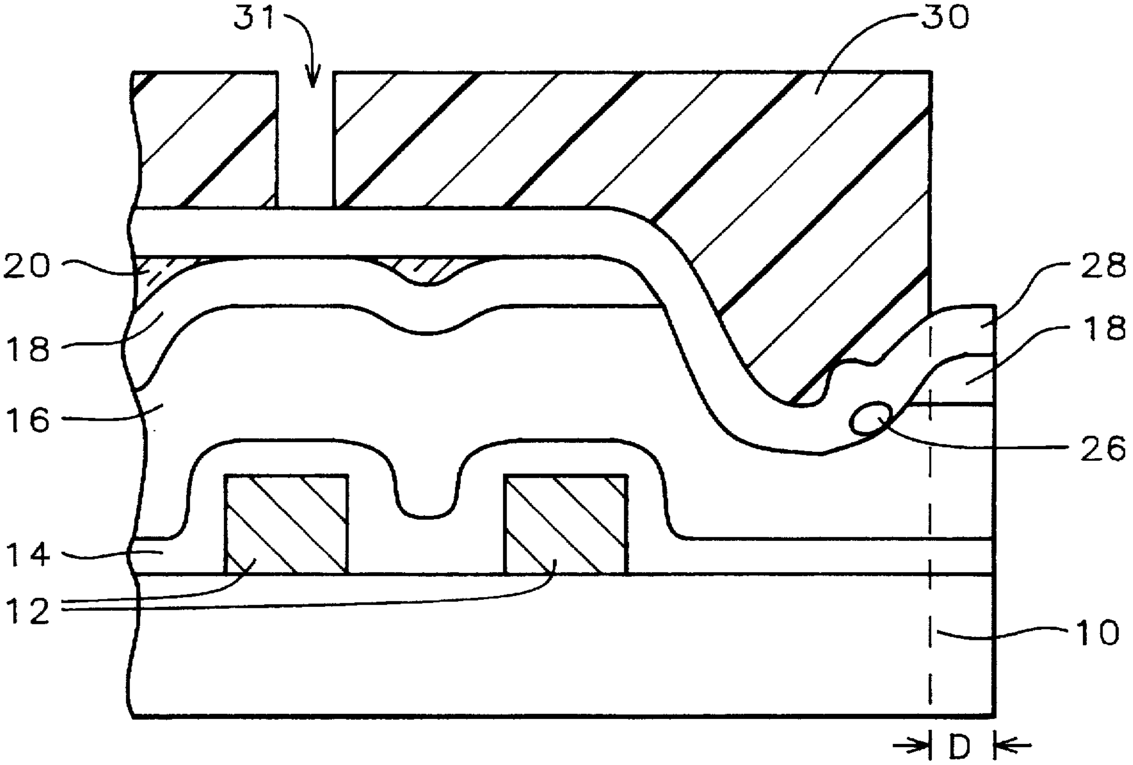
FIGS. 4 and 5 are cross-sectional representations of the oxide peeling problem of the prior art.
Figure 5:
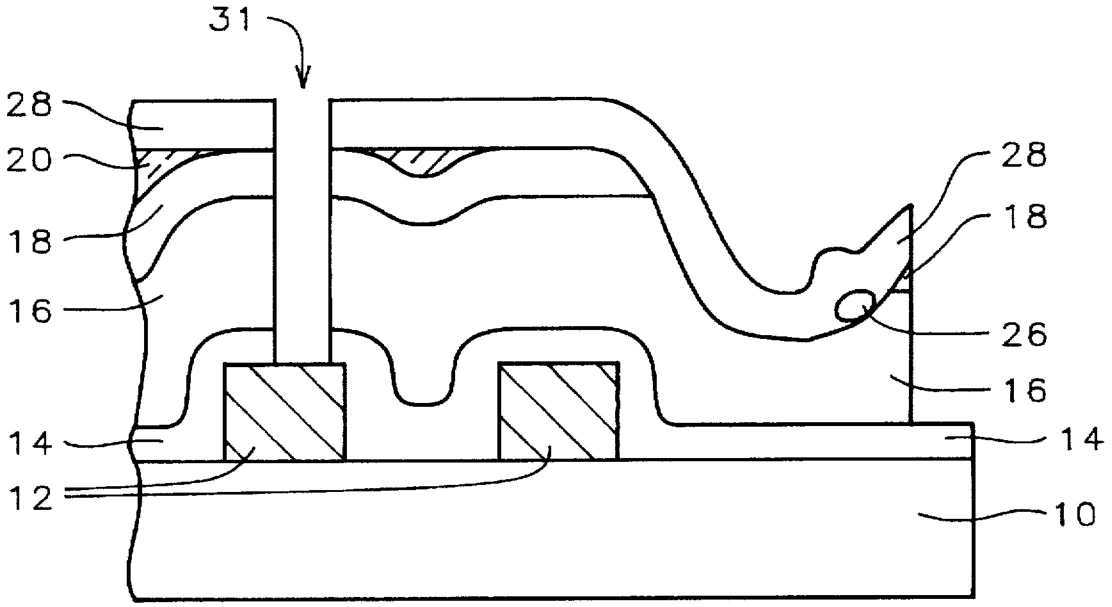

FIGS. 4 and 5 illustrate the oxide peeling problem of the prior art. A layer of photoresist 30 is coated over the wafer and patterned to form a via mask. The photoresist mask has an edge exclusion of D, about 1.3 to 1.5 mm. This edge exclusion is desired to prevent contamination of the stepper and the etch chamber.

Using the photoresist mask, the wafer is etched to form via openings, as shown in FIG. 5 at the edge of the wafer, and elsewhere, such as opening 31 which will form a contact to the underlying first metal line 12.

Because of the presence of the spin-on-glass within the intermetal dielectric, a vacuum bake must be done to avoid poisoned via, such as 31. The high temperature vacuum bake will cause the polymer buildup 26 to expand which in turn will cause the overlying oxide layer 28 to lift up and flake off, causing contamination of the wafer and of the production tools.

Figure 6:
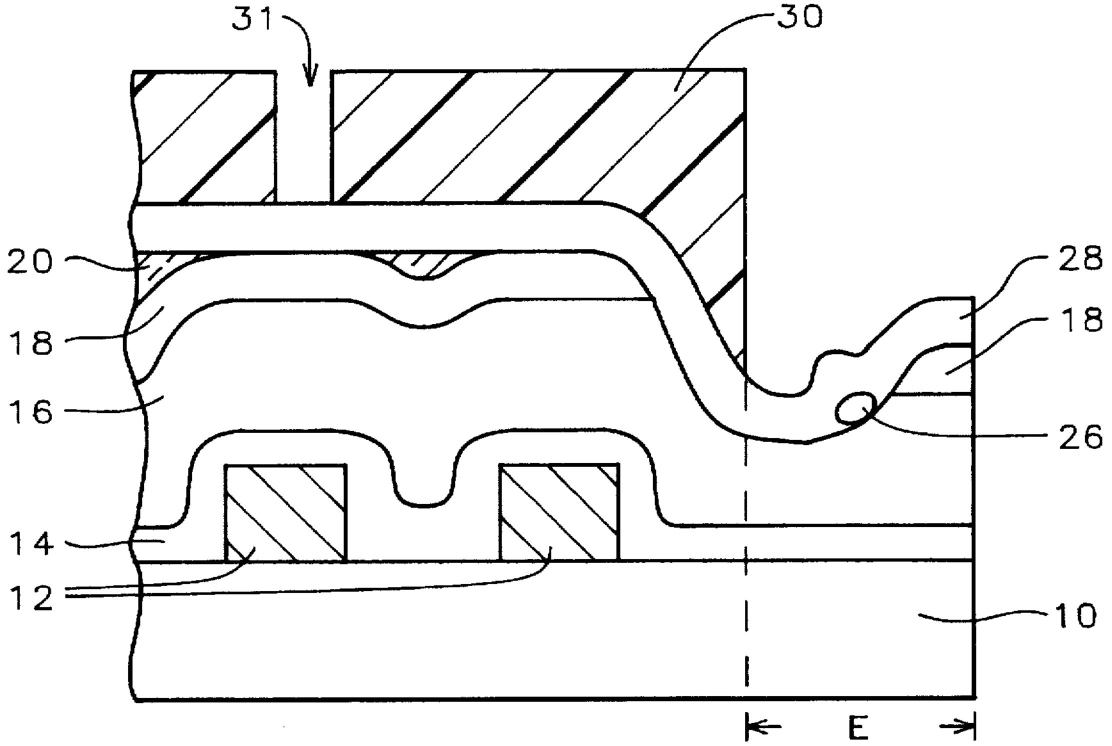
FIGS. 6 through 8 are cross-sectional representations of a preferred embodiment of the present invention.
Figure 7:
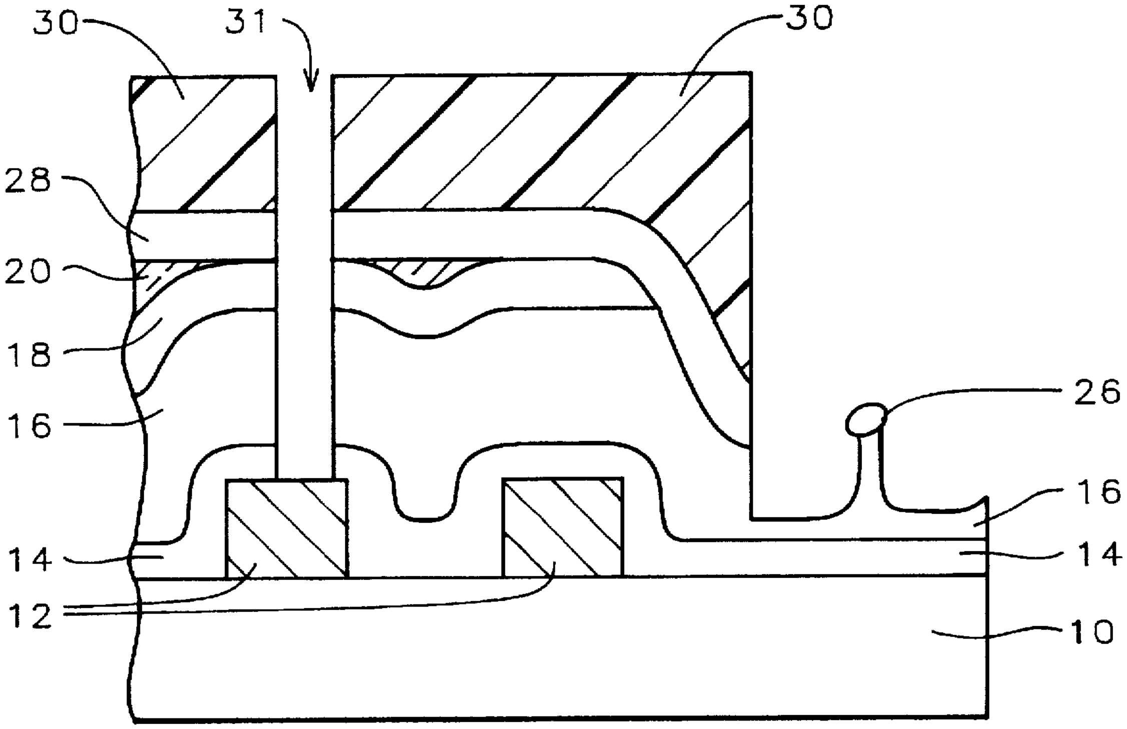

Referring now to FIGS. 6 and 7, the process of the invention to avoid oxide peeling will be described. Referring now more particularly to FIG. 6, the wafer is coated with photoresist, as in the prior art, which is patterned to form the photoresist mask for via etching. However, in the process of the present invention, the edge exclusion of the photoresist mask is greater than the distance E, which is about 2.25 mm from the edge of the wafer.

Referring to FIG. 7, the via openings are etched through the intermetal dielectric layer. The polymer 26 remains, but the oxide layer 28 overlying the polymer 26 is etched away since the photoresist mask does not cover the area of the polymer.

Figure 8:
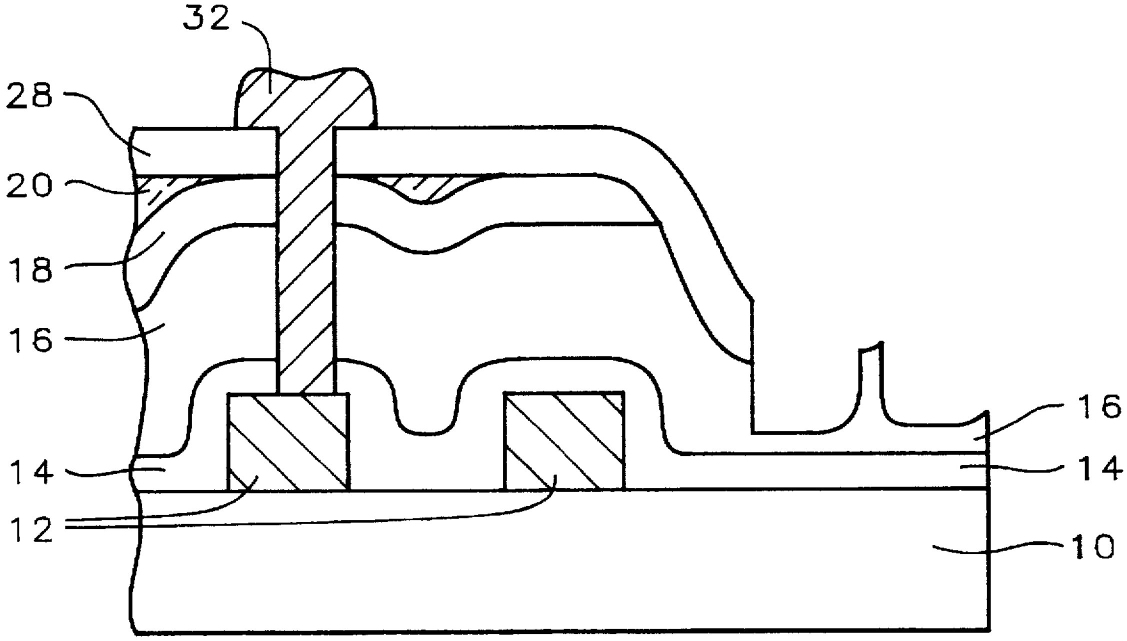

The photoresist strip step also removes the persistent polymer buildup 26, as shown in FIG. 8. The wet PR strip can be used at this point because only a small portion of the spin-on-glass within the via opening is vulnerable to absorbing water from the wet strip. A vacuum bake will be performed next to remove the water from the spin-on-glass layer. Because of the increased edge exclusion, the polymer is exposed so that it can be removed by the wet strip.

Now, the vacuum bake step is performed. Since the polymer has been removed, there is no danger of oxide peeling and therefore, no particle contamination of the wafer or tools.

Processing continues as is conventional in the art, such as filling the via opening 31 with a second metal layer 32, as shown in FIG. 8.

The process of the present invention provides for a reliable and very manufacturable method of avoiding oxide peeling and particle contamination by shifting the photoresist edge exclusion so that polymer buildup remaining after spin-on-glass etchback can be removed by a wet strip after via etching.

While the invention has been particularly shown and described with reference to the preferred embodiments thereof, it will be understood by those skilled in the art that various changes in form and details may be made without departing from the spirit and scope of the invention.

What is claimed is:

1. A method of removing polymer buildup at the edge of a wafer in the fabrication of an integrated circuit device comprising:
   - providing semiconductor device structures in and on a semiconductor substrate;
   - forming an interlevel dielectric sandwich layer overlying said semiconductor device structures comprising:
     - depositing a first oxide layer overlying said semiconductor device structures;
     - coating a spin-on-glass layer overlying said first oxide layer and rinsing said spin-on-glass layer whereby an edge bead rinse hump is formed a first distance from said edge of said wafer;
     - etching back said spin-on-glass layer wherein said wafer is held at said edge by a clamp a second distance from said edge of said wafer wherein said second distance is smaller than said first distance and wherein said etching back of said spin-on-glass layer forms said polymer on the surface of said first oxide layer under said clamp at a third distance between said first and second distances; and
     - depositing a second oxide layer overlying said etched back spin-on-glass layer and overlying said polymer at said edge of said wafer to complete said interlevel dielectric sandwich layer;
   - coating a layer of photoresist overlying said interlevel dielectric sandwich layer wherein said photoresist layer does not extend closer to said edge of said wafer than said third distance;
   - patterning said photoresist layer to form a photoresist mask;
   - etching away said interlevel dielectric sandwich layer where it is not covered by said photoresist mask to form via openings wherein said second oxide layer overlying said polymer is etched away; and
   - stripping said photoresist mask whereby said polymer is also removed at said edge of said wafer in the fabrication of said integrated circuit device.

2. The method according to claim 1 wherein said semiconductor device structures comprise gate electrodes and associated source and drain regions.

3. The method according to claim 1 wherein said semiconductor device structures comprise gate electrodes and associated source and drain regions, an insulating layer overlying said gate electrodes, a plurality of metal lines having gaps therebetween overlying said insulating layer; and a gap-filling dielectric layer filling said gaps between said metal lines.

4. The method according to claim 1 wherein said first distance is between about 2.8 and 3.0 mm.

5. The method according to claim 1 wherein said second distance is greater than about, 1.5 mm.

6. The method according to claim 1 wherein said third distance is between about 1.5 and 2.25 mm.

7. A method of avoiding oxide peeling by removing polymer buildup at the edge of a wafer in the fabrication of an integrated circuit device comprising:
   - providing semiconductor device structures in and on a semiconductor substrate wherein said semiconductor device structures include in a topmost layer a plurality of metal lines having a gap therebetween;
   - depositing a gap-filling dielectric layer overlying said metal lines whereby said gap is filled;
   - forming an intermetal dielectric sandwich layer comprising:

depositing a first oxide layer overlying said gap-filling dielectric layer;

coating a spin-on-glass layer overlying said first oxide layer and rinsing said spin-on-glass layer whereby an edge bead rinse hump is formed a first distance from said edge of said wafer;

etching back said spin-on-glass layer wherein said wafer is held at said edge by a clamp a second distance from said edge of said wafer wherein said second distance is smaller than said first distance and wherein said etching back of said spin-on-glass layer forms said polymer on the surface of said first oxide layer under said clamp at a third distance between said first and second distances; and depositing a second oxide layer overlying said etched back spin-on-glass layer and overlying said polymer at said edge of said wafer to complete said intermetal dielectric sandwich layer;

coating a layer of photoresist overlying said intermetal dielectric sandwich layer wherein said photoresist layer does not extend closer to said edge of said wafer than said third distance;

patterning said photoresist layer to form a photoresist mask;

etching away said intermetal dielectric sandwich layer where it is not covered by said photoresist mask to form via openings wherein said second oxide layer overlying said polymer is etched away; and stripping said photoresist mask whereby said polymer is also removed thereby avoiding oxide peeling at said edge of said wafer in the fabrication of said integrated circuit device.

8. The method according to claim 7 wherein said semiconductor device structures comprise gate electrodes and associated source and drain regions underlying said topmost layer.

9. The method according to claim 7 wherein said first distance is between about 2.8 and 3.0 mm.

10. The method according to claim 7 wherein said second distance is greater than about 1.5 mm.

11. The method according to claim 7 wherein said third distance is between about 1.5 and 2.25 mm.

12. A method of removing polymer buildup at the edge of a wafer in the fabrication of an integrated circuit device comprising:

providing semiconductor device structures in and on a semiconductor substrate;

forming an interlevel dielectric sandwich layer overlying said semiconductor device structures comprising:

depositing a first oxide layer overlying said semiconductor device structures;

coating a spin-on-glass layer overlying said first oxide layer and rinsing said spin-on-glass layer whereby an edge bead rinse hump is formed a first distance from said edge of said wafer;

etching back said spin-on-glass layer wherein said wafer is held at said edge by a clamp a second distance of greater than about 1.5 mm from said edge of said wafer wherein said second distance is smaller than said first distance and wherein said etching back of said spin-on-glass layer forms said polymer on the surface of said first oxide layer under said clamp at a third distance between said first and second distances; and depositing a second oxide layer overlying said etched back spin-on-glass layer and overlying said polymer at said edge of said wafer to complete said interlevel dielectric sandwich layer;

coating a layer of photoresist overlying said interlevel dielectric sandwich layer wherein said photoresist layer does not extend closer to said edge of said wafer than said third distance;

patterning said photoresist layer to form a photoresist mask;

etching away said interlevel dielectric sandwich layer where it is not covered by said photoresist mask to form via openings wherein said second oxide layer overlying said polymer is etched away; and stripping said photoresist mask whereby said polymer is also removed at said edge of said wafer in the fabrication of said integrated circuit device.

13. The method according to claim 12 wherein said first distance is between about 2.8 and 3.0 mm.

14. The method according to claim 12 wherein said third distance is between about 1.5 and 2.25 mm.

* * * * *